US012555919B2

(12) United States Patent
Dalmia et al.

(10) Patent No.: US 12,555,919 B2
(45) Date of Patent: Feb. 17, 2026

(54) INTEGRATION OF RADIO FREQUENCY FRONT-END FOR SIZE REDUCTION AND IMPROVED PERFORMANCE

(71) Applicant: Apple Inc., Cupertino, CA (US)

(72) Inventors: Sidharth S. Dalmia, San Jose, CA (US); David M. Signoff, Santa Clara, CA (US); Jennifer M. Edwards, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 412 days.

(21) Appl. No.: 18/092,683

(22) Filed: Jan. 3, 2023

(65) Prior Publication Data

US 2024/0222877 A1   Jul. 4, 2024

(51) Int. Cl.
*H01Q 15/14* (2006.01)
*H01Q 1/22* (2006.01)

(52) U.S. Cl.
CPC ......... *H01Q 15/142* (2013.01); *H01Q 1/2283* (2013.01)

(58) Field of Classification Search
CPC ...... H01Q 1/2283; H01Q 21/30; H01L 23/66; H01L 23/31; H01L 23/538; H01L 2223/6677; H01L 2223/6616; H05K 1/0243; H05K 2201/10098
See application file for complete search history.

(56) References Cited

U.S. PATENT DOCUMENTS

| | | | |
|---|---|---|---|
| 8,854,277 B2 | 10/2014 | De Graauw et al. |
| 9,196,958 B2 | 11/2015 | Arnold et al. |
| 9,514,881 B2 | 12/2016 | Hong et al. |
| 10,033,423 B2 | 7/2018 | Reisner et al. |
| 10,050,021 B1 | 8/2018 | Lin et al. |
| 10,629,553 B2 | 4/2020 | Soliman et al. |
| 10,886,606 B2 | 1/2021 | Kamgaing et al. |
| 2018/0062618 A1 | 3/2018 | Nagarkar et al. |
| 2019/0305402 A1 | 10/2019 | Dalmia et al. |
| 2019/0372210 A1 | 12/2019 | Mikata |

(Continued)

FOREIGN PATENT DOCUMENTS

| | | |
|---|---|---|
| TW | 201537720 A | 10/2015 |
| TW | 201824638 A | 7/2018 |

(Continued)

OTHER PUBLICATIONS

International Search Report and Written Opinion of the International Searching Authority directed to related International Patent Application No. PCT/US2023/084295, mailed Apr. 9, 2024; 8 pages.

*Primary Examiner* — Moazzam Hossain
(74) *Attorney, Agent, or Firm* — Sterne, Kessler, Goldstein & Fox, P.L.L.C.

(57) ABSTRACT

A radio frequency package for an electronic device with a reduced size and improved performance is presented herein. The radio frequency package includes a front-end package, transceiver dies and at least one antenna array providing a wireless communication functionality for the radio frequency package. The front-end package includes a radio frequency front-end die and at least one power control die connected to an insulation film substrate via first connectors. Each of the transceiver dies is connected to the at least one antenna array using second connectors.

20 Claims, 10 Drawing Sheets

(56) References Cited

U.S. PATENT DOCUMENTS

| | | |
|---|---|---|
| 2020/0212536 A1* | 7/2020 | Gupta ................. H01Q 1/2283 |
| 2020/0253040 A1 | 8/2020 | Dalmia et al. |
| 2021/0233865 A1* | 7/2021 | Tarui ................... H01Q 21/065 |
| 2021/0242896 A1 | 8/2021 | Kim et al. |
| 2021/0257736 A1 | 8/2021 | Heo et al. |
| 2022/0131277 A1 | 4/2022 | Rahman et al. |
| 2022/0278439 A1 | 9/2022 | Dalmia et al. |
| 2023/0420396 A1 | 12/2023 | Acikalin et al. |

FOREIGN PATENT DOCUMENTS

| | | |
|---|---|---|
| TW | 201943053 A | 11/2019 |
| TW | 202226510 A | 7/2022 |

* cited by examiner

INTEGRATION OF RADIO FREQUENCY FRONT-END FOR SIZE REDUCTION AND IMPROVED PERFORMANCE

BACKGROUND

1. Field of the Disclosure

The present disclosure relates to packaging technology, and more specifically to an integration of a radio frequency front-end for size reduction and improved performance.

2. Description of the Related Arts

Generally, radio frequency devices may include a package, such as a system in package. A system-in-package incorporates substrates, dies, multiple integrated circuits, and/or passive devices into a single package. The system-in-package may be made of semiconducting material, such as silicon. For example, the substrates and dies may include silicon on which the integrated circuits are fabricated. The substrates, dies, and devices may be coupled by wires bonded to the package or by solder joints (e.g., solder balls or pads). By way of example, the dies may be stacked (e.g., two-and-a-half-dimensional (2.5D) or three-dimensional (3D) stack structure) to combine the dies into the same package rather than placing them on a printed circuit board. In some instances, the system-in-package may also include multiple packages that are stacked (e.g., using a package on package technique) or have dies embedded in a substrate.

By way of example, radio frequency devices that support communication over millimeter wave (mmWave) range frequencies often provide support at frequencies at or near 30 GHz. In some instances, radio frequency devices may also support the mmWave communication over additional mmWave bands for broader frequency coverage, such as for 30-300 GHz. Multiple antennas (e.g., an antenna array) of the radio frequency devices may send signals that are combined to form a beam (e.g., a beamformed signal) for communication over the mmWave. To enable consistent coverage (e.g., from base stations associated with the mmWave communications), the radio frequency devices may include multiple antenna arrays positioned in different parts of the radio frequency devices. However, fitting these multiple antenna arrays in the system-in-package of the radio frequency devices may take up space and undesirably increase the size of the radio frequency devices.

SUMMARY

Embodiments of the present disclosure relate to a radio frequency package for an electronic device with a reduced size and improved performance. The radio frequency package includes a front-end package, an antenna array, and multiple transceiver dies. The antenna array and the multiple transceiver dies provide a wireless communication functionality for the electronic device. The front-end package includes a radio frequency front-end die and a power control die connected to an insulation film substrate via first connectors. Each of the transceiver dies is connected to the antenna array using second connectors.

Embodiments of the present disclosure are further directed to a radio frequency package that includes a front-end package, multiple antenna arrays, and multiple transceiver dies. The front-end package includes a radio frequency front-end die and a power control die connected onto an insulation film substrate via first connectors. The antenna arrays and the transceiver dies provide a wireless communication functionality for the electronic device. Each of the transceiver dies is connected onto a respective antenna array using second connectors.

Embodiments of the present disclosure are further directed to a radio frequency package that includes an antenna array and multiple transceiver dies configured to provide a wireless communication functionality for an electronic device that integrates the radio frequency package. Each of the transceiver dies is connected onto the antenna array using first connectors. The radio frequency package may further include a radio frequency front-end die, at least one power control die, and a mold (e.g., stepped mold having portions of different heights). The mold may be placed onto the antenna array, and each of the transceiver dies may be integrated into the mold.

Figure 1A:
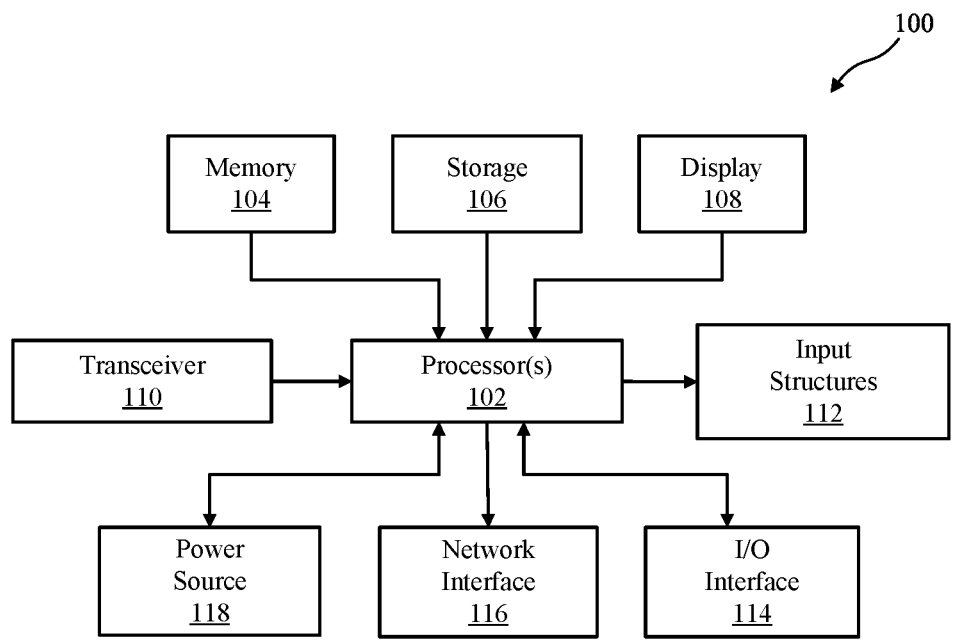
FIG. 1A is a high-level diagram of an electronic device, according to one embodiment.

The figures depict, and the detail description describes, various non-limiting embodiments for purposes of illustration only.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, the described embodiments may be practiced without these specific details. In other instances, well-known methods, procedures, components, circuits, and networks have not been described in detail so as not to unnecessarily obscure aspects of the embodiments.

Embodiments of the present disclosure relate to a radio frequency package for an electronic device with components of a front-end die integrated with one or more antenna arrays for size reduction and improved performance. The radio frequency package may include a front-end package, a multi-layer board, multiple transceiver dies, and an antenna array module. The front-end package may include a front-end die of a reduced size and at least one power management unit die connected to an insulation film substrate (e.g., Ajinomoto build-up film) via a first array of connectors (e.g., solder ball connectors). The insulation film substrate may be connected to a top side of the multi-layer board using a second array of connectors (e.g., solder ball connectors). The transceiver dies may be placed on top of the antenna array module and integrated into an antenna substrate (e.g., mold). The front-end package may include the front-end die of the reduced size as the certain functionality of the front-end die is offloaded to the transceiver dies that are directly coupled to the antenna array module. The antenna array module may be coupled to the multi-layer board using via connectors. In some embodiments, the antenna array module is divided into multiple antenna array sub-modules, and the antenna substrate is divided into multiple antenna substrate portions (e.g., multiple mold portions) with a space between each two adjacent antenna substrate portions. Each transceiver die may be connected to the respective antenna array sub-module using a third array of connectors (e.g., solder ball connectors). Each transceiver die may be also integrated into a respective antenna substrate portion (e.g., respective mold).

Exemplary Electronic Device

Embodiments of electronic devices, user interfaces for such devices, and associated processes for using such devices are described. In some embodiments, the device is a portable communications device, such as a mobile telephone, that also contains other functions, such as personal digital assistant (PDA) and/or music player functions. Exemplary embodiments of portable multifunction devices include, without limitation, the iPhone®, iPod Touch®, Apple Watch®, and iPad® devices from Apple Inc. of Cupertino, California. Other portable electronic devices, such as wearables, laptops or tablet computers, are optionally used. In some embodiments, the device is not a portable communication device, but is a desktop computer or other computing device that is not designed for portable use. In some embodiments, the disclosed electronic device may include a touch-sensitive surface (e.g., a touch screen display and/or a touchpad). An example electronic device described below in conjunction with Figure (FIG. 1 (e.g., an electronic device 100) may include a touch-sensitive surface for receiving user input. The electronic device may also include one or more other physical user-interface devices, such as a physical keyboard, a mouse and/or a joystick.

FIG. 1A is a high-level diagram of electronic device 100, according to one embodiment. Electronic device 100 may include, among other components, one or more processor(s) 102, a memory 104, a nonvolatile storage 106, a display 108, input structures 112, an input/output (I/O) interface 114, a network interface 116, a power source 118, and a transceiver 110. The various functional blocks shown in FIG. 1A may include hardware elements (including circuitry), software elements (including computer code stored on a computer-readable medium) or a combination of both hardware and software elements. It should be noted that FIG. 1A is merely one example of a particular implementation and is intended to illustrate the types of components that may be present in electronic device 100.

Figure 1B:
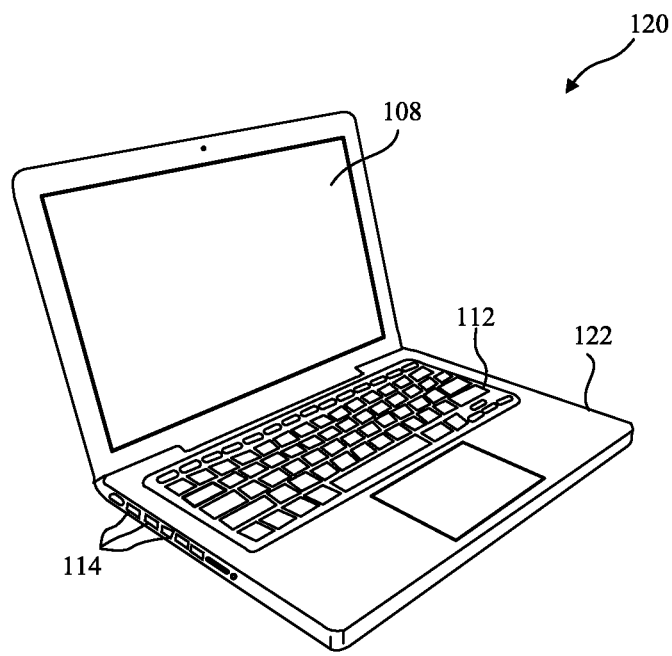
FIG. 1B is a perspective view of a notebook computer representing an embodiment of the electronic device of FIG. 1A.
Figure 1D:
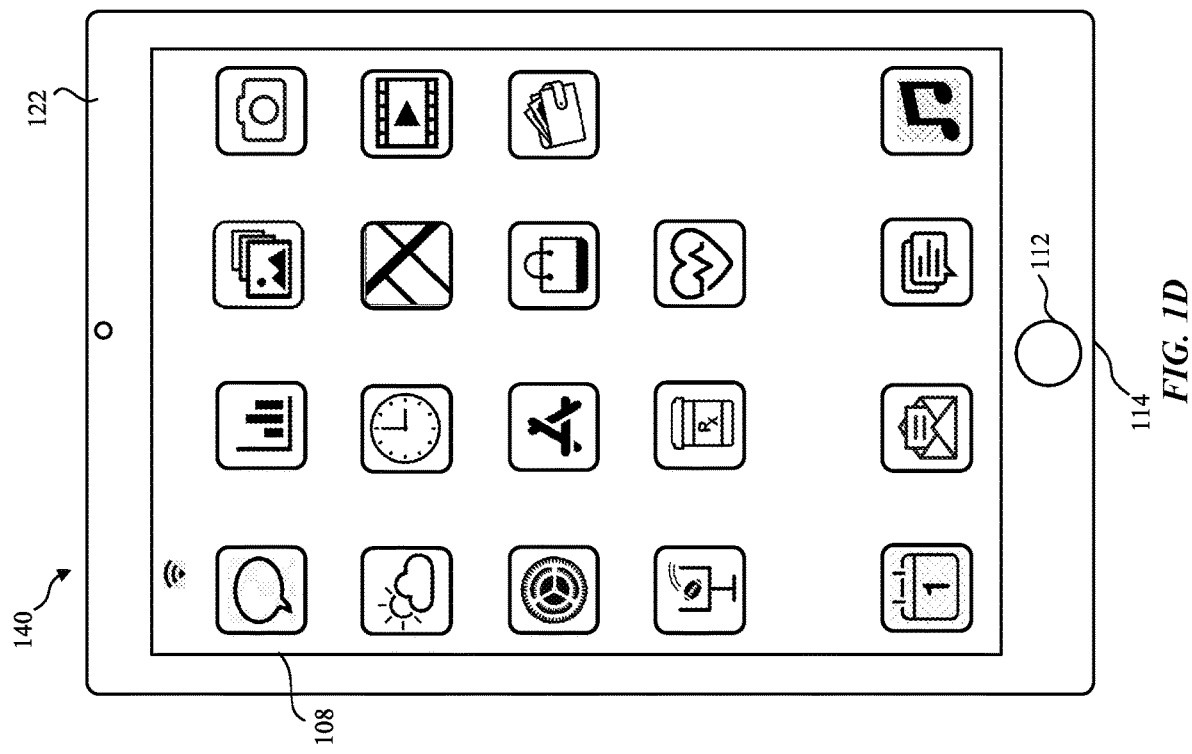
FIG. 1D is a front view of another handheld device representing another embodiment of the electronic device of FIG. 1A, according to one embodiment.
Figure 1C:
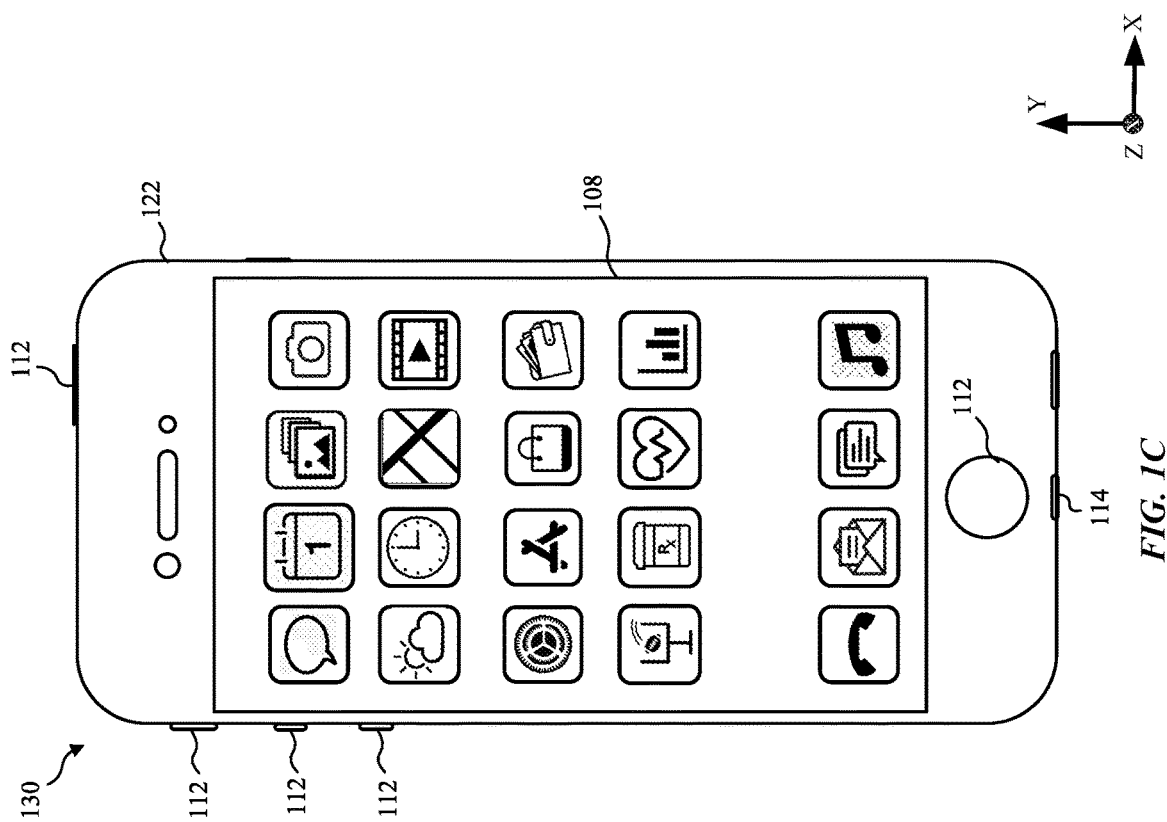
FIG. 1C is a front view of a handheld device representing another embodiment of the electronic device of FIG. 1A, according to one embodiment.
Figure 1E:
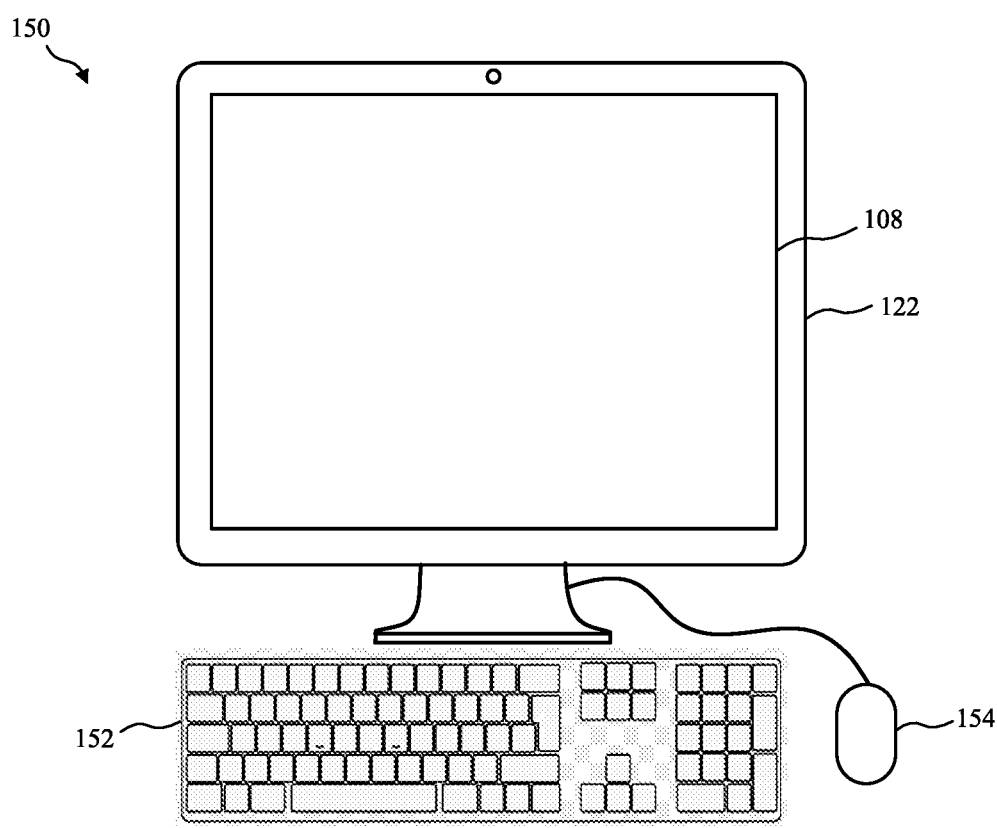
FIG. 1E is a front view of a desktop computer representing another embodiment of the electronic device of FIG. 1A, according to one embodiment.
Figure 1F:
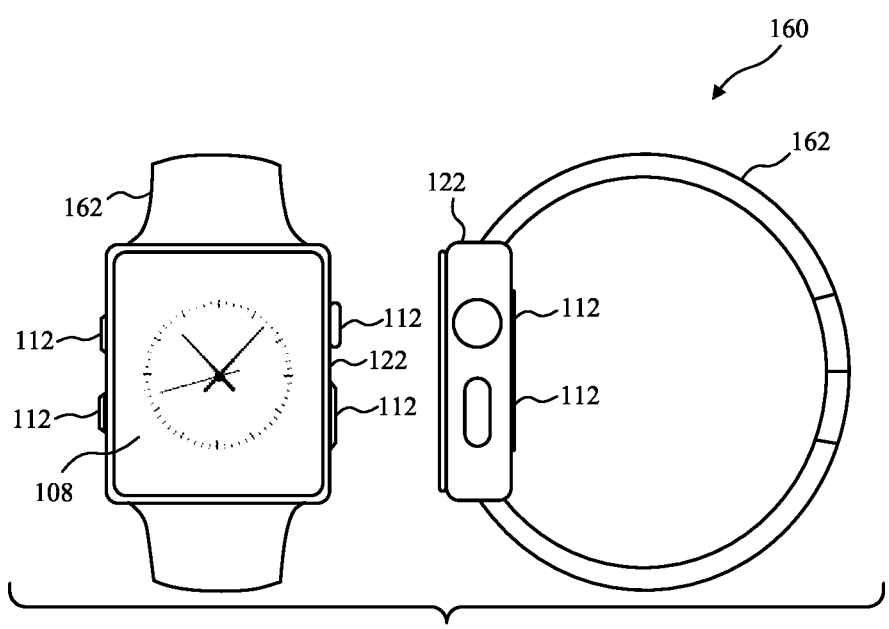
FIG. 1F is a front view and side view of a wearable electronic device representing another embodiment of the electronic device of FIG. 1A, according to one embodiment.

By way of example, electronic device 100 may represent a block diagram of a notebook computer depicted in FIG. 1B, handheld device depicted in FIG. 1C, handheld device depicted in FIG. 1D, desktop computer depicted in FIG. 1E, wearable electronic device depicted in FIG. 1F, or similar devices. It should be noted that processor(s) 102 and other related items in FIG. 1A may be generally referred to herein as "data processing circuitry." Such data processing circuitry may be embodied wholly or in part as software, hardware, or any combination thereof. Furthermore, processor(s) 102 and other related items in FIG. 1A may be a single contained processing module or may be incorporated wholly or partially within any of the other elements within electronic device 100.

In electronic device 100 of FIG. 1A, processor(s) 102 may be operably coupled with memory 104 and nonvolatile storage 106 to perform various algorithms. For example, algorithms for adjusting input/output power of antennas may be saved in memory 104 and/or nonvolatile storage 106. Such algorithms or instructions executed by processor(s) 102 may be stored in any suitable article of manufacture that includes one or more tangible, computer-readable media. Moreover, antenna gain lookup tables used for determining total transmission gains and/or total reception gains may be saved in memory 104 and/or nonvolatile storage 106. Specifically, one or more codebooks may be stored in memory 104 and/or nonvolatile storage 106. The tangible, computer-readable media may include memory 104 and/or nonvolatile storage 106, individually or collectively, to store the algorithms or instructions. Memory 104 and nonvolatile storage 106 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by processor(s) 102 to enable electronic device 100 to provide various functionalities.

In certain embodiments, display 108 may be a liquid crystal display (LCD), which may facilitate users to view images generated on electronic device 100. In some embodiments, display 108 may include a touch screen, which may facilitate user interaction with a user interface of electronic device 100. Furthermore, it should be appreciated that, in some embodiments, display 108 may include one or more light-emitting diode (LED) displays, organic light-emitting diode (OLED) displays, active-matrix organic light-emitting diode (AMOLED) displays, or some combination of these and/or other display technologies.

Input structures 112 of electronic device 100 may enable a user to interact with electronic device 100 (e.g., pressing a button to increase or decrease a volume level). I/O interface 114 may enable electronic device 100 to interface with various other electronic devices, as may network interface 116. Network interface 116 may include, for example, one or more interfaces for a personal area network (PAN), such as a BLUETOOTH® network, for a local area network (LAN) or wireless local area network (WLAN), such as an 802.11x WI-FI® network, and/or for a wide area network (WAN), such as a $3^{rd}$ generation (3G) cellular network, universal mobile telecommunication system (UMTS), $4^{th}$ generation (4G) cellular network, long term evolution (LTE®) cellular network, long term evolution license assisted access (LTE-LAA) cellular network, $5^{th}$ generation (5G) cellular network, and/or New Radio (NR) cellular network. In particular, network interface 116 may include, for example, one or more interfaces for using a Release-15 cellular communication standard of the 5G specifications that include the millimeter wave (mmWave) frequency range (e.g., 30-300 GHz). Transceiver 110 of electronic device 100, which includes a transmitter and receiver, may allow communication over the aforementioned networks (e.g., 5G, Wi-Fi, LTE-LAA, etc.).

Network interface 116 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, etc.

In some embodiments, electronic device 100 communicates over the aforementioned wireless networks (e.g., WI-FI®, WIMAX®, mobile WIMAX®, 4G, LTE®, 5G, etc.) using transceiver 110. Transceiver 110 may include circuitry useful in both wirelessly receiving the reception signals at the receiver and wirelessly transmitting the transmission signals from the transmitter (e.g., data signals, wireless data signals, wireless carrier signals, radio frequency signals). In some embodiments, transceiver 110 may include the transmitter and the receiver combined into a single unit, or, in other embodiments, transceiver 110 may include the transmitter separate from the receiver. Transceiver 110 may transmit and receive radio frequency signals to support voice and/or data communication in wireless applications such as, for example, PAN networks (e.g., BLUETOOTH®), WLAN networks (e.g., 802.11x WI-FI®), WAN networks (e.g., 3G, 4G, 5G, NR, and LTE® and LTE-LAA cellular networks), WIMAX® networks, mobile WIMAX® networks, ADSL and VDSL networks, DVB-T® and DVB-H® networks, UWB networks, etc. As further illustrated, electronic device 100 may include power source 118. Power source 118 may include any suitable source of power, such as a rechargeable lithium polymer (Li-poly) battery and/or an alternating current (AC) power converter.

In certain embodiments, electronic device 100 may take the form of a computer, a portable electronic device, a wearable electronic device, or other type of electronic device. Such computers may be generally portable (such as laptop, notebook, and tablet computers), or generally used in one place (such as desktop computers, workstations, and/or servers). In certain embodiments, electronic device 100 in the form of a computer may be a model of a MacBook®, MacBook® Pro, MacBook Air®, iMac®, Mac® mini, or Mac Pro® available from Apple Inc. of Cupertino, California. By way of example, electronic device 100, taking the form of a notebook computer 120, is illustrated in FIG. 1B in accordance with one embodiment of the present disclosure. Notebook computer 120 may include a housing or enclosure 122, a display 108, input structures 112, and ports of an I/O interface 114. In one embodiment, input structures 112 (such as a keyboard and/or touchpad) may be used to interact with computer 120, such as to start, control, or operate a graphical user interface (GUI) and/or applications running on computer 120. For example, a keyboard and/or touchpad may allow a user to navigate a user interface and/or an application interface displayed on display 108.

FIG. 1C depicts a front view of a handheld device 130, which represents one embodiment of electronic device 100. Handheld device 130 may represent, for example, a portable phone, a media player, a personal data organizer, a handheld game platform, or any combination of such devices. By way of example, handheld device 130 may be a model of an iPhone® available from Apple Inc. of Cupertino, California.

Handheld device 130 may include an enclosure 122 to protect interior components from physical damage and/or to shield them from electromagnetic interference. Enclosure 122 may surround display 108. I/O interfaces 114 may open through enclosure 122 and may include, for example, an I/O port for a hardwired connection for charging and/or content manipulation using a standard connector and protocol, such as the Lightning connector provided by Apple Inc. of Cupertino, California, a universal serial bus (USB), or other similar connector and protocol. Interfaces 114 may be associated with wiring and connectors within the radio frequency packaging of electronic device 100. The wiring and connectors may result in particular areas within a system package of electronic device 100 that are available for placing components to facilitate supporting multiple wireless communication protocols and capabilities. By way of example, if handheld device 130 is positioned upward along a positive portion of z-axis and facing a positive portion of y-axis, an antenna array of a right side panel of handheld device 130 may be disposed and radiate signals in a positive portion of x-axis. Similarly, an antenna array of a left side panel may be disposed and radiate signals in a negative portion of x-axis, an antenna array of a front glass panel (e.g., front surface panel) may be disposed and radiate signals in the positive portion of y-axis, and an antenna array of a back glass panel (e.g., rear surface panel) may be disposed and radiate signals in a negative portion of y-axis.

Input structures 112, in combination with display 108, may allow a user to control handheld device 130. For example, input structures 112 may activate or deactivate handheld device 130, navigate user interface to a home screen, a user-configurable application screen, and/or activate a voice-recognition feature of handheld device 130. Other input structures 112 may provide volume control, or may toggle between vibrate and ring modes. Input structures 112 may also include a microphone that may obtain a user's voice for various voice-related features, and a speaker that may enable audio playback and/or certain phone capabilities. Input structures 112 may also include a headphone input that may provide a connection to external speakers and/or headphones.

FIG. 1D depicts a front view of another handheld device 140, which represents another embodiment of electronic device 100. Handheld device 140 may represent, for example, a tablet computer, or one of various portable computing devices. By way of example, handheld device 140 may be a tablet-sized embodiment of electronic device 100, which may be, for example, a model of an iPad® available from Apple Inc. of Cupertino, California.

Turning to FIG. 1E, a computer 150 may represent another embodiment of electronic device 100 of FIG. 1A. Computer 150 may be any computer, such as a desktop computer, a server, or a notebook computer, but may also be a standalone media player or video gaming machine. By way of example, computer 150 may be an iMac®, a MacBook®, or other similar device by Apple Inc. of Cupertino, California. It should be noted that computer 150 may also represent a personal computer (PC) by another manufacturer. A similar enclosure 122 may be provided to protect and enclose internal components of computer 150, such as display 108. In certain embodiments, a user of computer 150 may interact with computer 150 using various peripheral input structures 112, such as a keyboard 152 or a mouse 154 (e.g., input structures 112), which may connect to computer 150.

Similarly, FIG. 1F depicts a wearable electronic device 160 representing another embodiment of electronic device 100 that may be configured to operate using the techniques described herein. By way of example, wearable electronic device 160, which may include a wristband 162, may be an Apple Watch® by Apple Inc. of Cupertino, California. However, in other embodiments, wearable electronic device 160 may include any wearable electronic device such as, for example, a wearable exercise monitoring device (e.g., pedometer, accelerometer, heart rate monitor), or other device by another manufacturer. Display 108 of wearable electronic device 160 that is surrounded by enclosure 122 may include a touch screen display 108 (e.g., LCD, LED display, OLED display, AMOLED display, etc.), as well as input structures 112, which may allow users to interact with a user interface of wearable electronic device 160.

Figure 2:
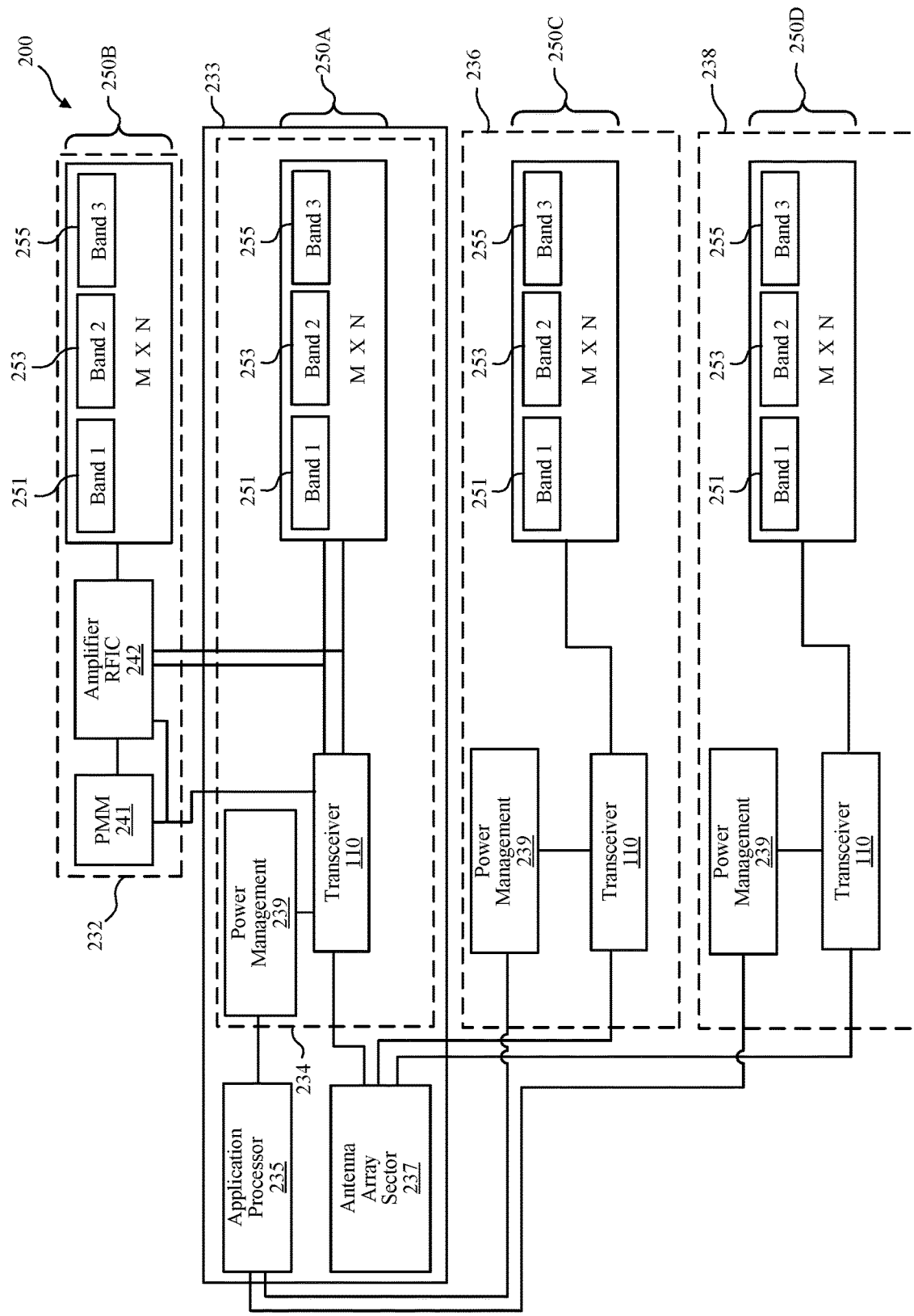
FIG. 2 is a schematic diagram of a system package of the electronic device of FIG. 1A, according to one embodiment.

FIG. 2 is a schematic diagram of a system package 200 of electronic device 100 of FIG. 1A. Although the depicted embodiment shows multiple panels on different sides and on the same layer of electronic device 100, the systems described herein also apply to stacked panels, such as a three-dimensional (3D) stack of printed circuit boards. That is, one or more of the panels may be positioned on top of or beneath one or more other panels. Moreover, at least one of the panels may include a redistribution printed circuit board that provides a connection between the panels that are coupled to the redistribution printed circuit board.

In the depicted embodiment, system package 200 includes packaging for a front glass panel 232 (e.g., front surface panel or cover glass panel), a main logic board 233 with a back glass panel 234, a left side panel 236, and a right side panel 238. Although the following descriptions describe panels 232, 234, 236, and 238 as disposed respectively on the front, back, left, and right side of electronic device 100, which represents a particular embodiment, system package 200 described herein may additionally or alternatively include panel(s) disposed at other areas of electronic device 100 that may include one or more antennas. For example, system package 200 may also include top side or bottom side panels disposed respectively at the top or bottom of electronic device 100, adjacent to left side panel 236 and right side panel 238. Moreover, although the following descriptions describe an antenna array, which represents a particular embodiment, system package 200 described herein may additionally or alternatively include multiple antenna arrays.

Main logic board 233 may include back glass panel 234, a power management circuit 239, transceiver 110, an antenna array selector 237, an application processor 235, and a first antenna array 250A. Application processor 235 may be coupled to power management circuit 239 to control power functions, including those related to wireless communications. Power management circuit 239 may include one or more integrated circuits and control power (e.g., via processor 102) provided to components of main logic board 233 and/or electronic device 100, including, for example, transceiver 110 and/or antenna array selector 237. By way of example, power management circuit 239 may control supplying power to main logic board 233, providing power to components on or coupled to main logic board 233, panels 232, 234, 236, and/or 238, selecting a power source, power sequencing, converting direct current (DC) for specific power related functions, charging a battery of electronic device 100, etc.

As shown, transceiver 110 may be coupled to antenna array selector 237, first antenna array 250A of back glass panel 234, and components of front glass panel 232. Antenna array 250A includes multiple antennas that transmit and/or receive wireless signals, and that may form a directional beam using signals emitted by each of the antennas. Transceiver 110, as previously discussed with respect to FIG. 1A, is a device that includes a transmitter and a receiver in a single package, and may transmit and receive data via wireless signals communicated on particular radio frequency using the antennas of first antenna array 250A. Specifically, transceiver 110 may include a transmitter and a receiver that include components that facilitate transmission and reception of wireless signals, such as those sent and received between electronic devices 100 using mmWave communication technology or any other suitable communication protocol. When communicating on the mmWave frequencies, electronic device 100 may utilize beamforming techniques to form the directional beam, as previously mentioned. The transmitter of transceiver 110 may include one or more phase shifters, transmitter power detectors, and power amplifiers. The transmitter phase shifters may modulate (e.g., phase-shift) transmission signals (e.g., wireless signals transmitted from antennas of first antenna array 250A) and may form a beam that may be steered in a particular direction (e.g., the directional beam), such as towards another electronic device (e.g., another electronic device 100, or a base station). The power amplifiers may amplify power level of transmission signals. Specifically, the power amplifiers may be supplied with a power amplifier supply voltage to control the amount of amplification provided by the power amplifiers (e.g., increase or decrease amplification, which may affect the antenna gain at the corresponding antennas). The transmitter power detectors may measure power of the transmission signals sent from the antennas of first antenna array 250A.

The receiver of transceiver 110 may include one or more receiver phase shifters, low noise amplifiers, and receiver power detectors. The receiver phase shifters and the receiver power detectors may function similarly to the transmitter phase shifters and the transmitter power detectors. The low noise amplifiers may amplify the power level of reception signals (e.g., wireless signals received at antennas of first antenna array 250A). Additional components in the transmitter and/or the receiver may include, but are not limited to, filters, mixers, and/or attenuators.

Antenna array selector 237, which may be coupled to transceiver 110, may activate or enable communication from one or more of the antennas of antenna arrays 250, such as first antenna array 250A. For example, based on data throughput, antenna array selector 237 may selectively enable a number of antennas to accommodate the data throughput. As shown, first antenna array 250A is disposed at back glass panel 234. Back glass panel 234 may include one or more printed circuit boards that are coupled to a rear surface (e.g., a back glass) of electronic device 100. As shown, first antenna array 250A may include an M×N array of first band antennas 251 (Band 1), second band antennas 253 (Band 2), and third band antennas 255 (Band 3). The M×N array may refer to M rows (e.g., one or more rows) and N columns (e.g., one or more columns) of antennas in which the number of rows, column, and/or antennas in the rows and columns may include any number antennas suitable for the particular application (e.g., communications over the mmWave). Additionally, although the following descriptions describe antenna arrays 250 with a particular number of first band antennas 251, second band antennas 253, and third band antennas 255, which represent particular embodiments, antenna arrays 250 may include one or more of any of first band antennas 251, second band antennas 253, and/or third band antennas 255. First band antennas 251 may enable communication in a first band or range of frequencies, second band antennas 253 may enable communication in a second band or range of frequencies, and third band antennas 255 may enable communication in a third band or range of frequencies. In some embodiments, the first band, the second band, and the third band may include different ranges of frequencies. By way of example, the first band may include low-band frequencies, such as 700 MHz to 1.0 GHz, second band antennas 253 may enable communication in mid-band frequencies, such as 1.8 GHz to 2.2 GHz, and third band antennas 255 may enable communication in high-band frequencies, such as 20 GHz to 80 GHz.

Additionally, transceiver 110 may be coupled to a power management module (PMM) 241 and an amplifier radio frequency integrated circuit (RFIC) 242 of front glass panel 232. Power management module 241 may provide power for the power amplifier of transceiver 110 to amplify power for the transmission signals. Amplifier RFIC 242 may provide mixing circuitry to demodulate radio frequency signals received by transceiver 110 and modulate intermediate frequency signals to radio frequency signals for transmitting transmission signals from transceiver 110.

In some embodiments, application processor 235 may control antenna array selector 237 and/or transceivers 110 (e.g., through antenna array selector 237), and by extension, antenna arrays 250 of front glass panel 232, back glass panel 234, left side panel 236, and/or right side panel 238. That is, antenna array selector 237 may enable one or more of the antennas of one or more antenna arrays 250 (e.g., antenna arrays 250A, 250B, 250C, 250D) to transmit or receive wireless signals via transceivers 110. In some embodiments, antenna array selector 237 may enable antennas of right side panel 238 to transmit signals contributing to a beamformed signal directed to the right with respect to electronic device 100. By way of example, if electronic device 130 of FIG. 1C is positioned upward in a positive portion of z-axis and facing a positive portion of y-axis, right side panel 238 may be disposed and radiate signals in a positive portion of x-axis. Application processor 235 may also be communicatively coupled to power management circuits 239 of each of front glass panel 232, main logic board 233, back glass panel 234, left side panel 236, and right side panel 238 to control power related functions with respect to each of the panels.

Application processor 235 may include one or more microprocessors, one or more "general-purpose" microprocessors, one or more special-purpose microprocessors, and/or one or more application specific integrated circuits (ASICs), or some combination thereof. For example, application processor 235 may include one or more reduced instruction set (RISC) processors. In some instances, application processor 235 may perform processing (e.g., execute software programs and/or instructions) for specific functions, such as specific wireless communication related functions. The specific functions may include receiving or generating wireless signals, selecting particular antennas for transmitting or receiving signals using antenna array selector 237, selecting an amplification level to amplify transmission signals using power management circuit 239, determining gain of the wireless signals transmitted and/or received from a particular transmitter and/or receiver associated with a particular antenna of antenna array 250, etc. In some instances, application processor 235 may be integrated with processor(s) 102 and perform additional functions related to the wireless communications, such as functions related to display 108, adjusting bandwidth consumption, and so on.

In some embodiments, application processor 235 may communicate with one or more memory devices (not shown in FIG. 2), such as memory 104 of FIG. 1A, for processing instructions to perform the functions related to wireless communications. The memory device may store information such as control software, configuration data, etc. In some embodiments, application processor 235 and the memory device may be external to main logic board 233 and/or system package 230. The memory device may include a tangible, non-transitory, machine-readable-medium, such as a volatile memory (e.g., a random access memory (RAM)) and/or a nonvolatile memory (e.g., a read-only memory (ROM)). The memory device may store a variety of information and may be used for various purposes. For example, the memory device may store machine-readable and/or processor-executable instructions (e.g., in the form of software or a computer program) for application processor 235 to execute, such as instructions for enabling communication from a particular antenna transmitting or receiving signals contributing to a beamformed signal transmitted or received in a particular beam direction at a particular frequency. The memory device may include one or more storage devices (e.g., nonvolatile storage devices) that may include ROM, flash memory, a hard drive, or any other suitable optical, magnetic, or solid-state storage medium, or a combination thereof.

As shown, system package 230 also includes front glass panel 232, which may include one or more printed circuit boards that are coupled to a cover glass associated with display 108. Front glass panel 232 may include a second antenna array 250B having M×N first band antennas 251, M×N second band antennas 253, and/or M×N third band antennas 255. The antennas of second antenna array 250B function similarly to the antennas of first antenna array 250A of main logic board 233. That is, by way of example, first band antennas 251 may communicate wireless signals on low-bands frequencies (e.g., 700 MHz to 1.0 GHz), second band antennas 253 may communicate wireless signals on mid-band frequencies (e.g., 1.8 GHz to 2.2 GHz), and third band antennas 255 may communicate wireless signals on high-band frequencies (e.g., 20 GHz to 80 GHz).

Front glass panel 232 may also include amplifier RFIC 242 (e.g., a low noise amplifier (LNA) and power amplifier (PA) radio frequency integrated circuit (RFIC)) and power management module 241. Amplifier RFIC 242 may include circuitry between antennas and mixing circuitry that, for example, process a signal at an incoming radio frequency (RF) before the signal is converted or demodulated to a lower intermediate frequency (IF) for processing (e.g., converting from RF to IF). By way of example, amplifier RFIC 242 may include a processor 102 that processes instructions for functions performed by amplifier RFIC 242 (e.g., instructions related to frequency conversion, transmitting signals from particular antennas and having particular amplification, receiving signals at particular antennas, etc.) and/or a memory 104 storing the instructions related to functions performed by amplifier RFIC 242. In some embodiments, amplifier RFIC 242 may include a band-pass filter to pass frequencies within a particular range and/or a stop-band filter to filter frequencies out the particular range, a low noise amplifier to increase a signal strength of an incoming signal, a local oscillator that generates a radio frequency signal at an offset from the incoming signal to be mixed with the incoming signal, and/or a mixer that mixes the incoming signal with a signal from the local oscillator to convert the incoming signal to the intermediate frequency. A power convertor (e.g., a direct current (DC)-to-DC convertor (DC-DC convertor)) of power management module 241 may supply power to the power amplifier of electronic device 100, for example, for amplifying a transmission signal. As such, dynamically changing the supply voltage from the power convertor may correspondingly change the amount of amplification to the transmission signal from the power amplifier. Furthermore, an average power tracking (APT) of power management module 241 may change the DC supply voltage based on an output power level to maintain linearity of the power amplifier while efficiency may be improved (e.g., reduce unnecessary power consumption by the power amplifier).

As illustrated, system package 200 also includes left side panel 236, which may include one or more printed circuit boards that are connected to a left side of electronic device 100. Left side panel 236 may also include a power management circuit 239, transceiver 110, and third antenna array 250C. Similarly, system package 200 includes a right side panel 238. Right side panel 238 may also include a power management circuit 239, transceiver 110, and fourth antenna array 250D. Power management circuits 239, transceivers 110, and antenna arrays 250C, 250D may operate and function similarly to power management circuit 239, transceiver 110, and first antenna array 250A, as discussed with respect to main logic board 233. As shown, third antenna array 250C and fourth antenna array 250D include M×N first band antennas 251, second band antennas 253, and third band antennas 255. As previously mentioned, by way of example, first band antennas 251 may communicate wireless signals on low-band frequencies, second band antennas 253 may communicate wireless signals on mid-band frequencies, and third band antennas 255 may communicate wireless signals on high-band frequencies.

As previously discussed, integrating the antennas of antenna arrays 250, transceivers 110, and power management circuits 239, within the same particular area within a package of the panels of system package 200 may be difficult. Specifically, transceiver 110 and antenna array 250 may be co-located (e.g., near each other in the same or approximately the same area) in the package so that transceiver 110 may efficiently control amplification, phase, gain, etc., of the wireless signals while minimizing signal loss and noise that may otherwise result from longer communication pathways between transceiver 110 and antenna array 250 (e.g., not co-located). Similarly, power management circuit 239 may be co-located with transceiver 110 and antenna array 250 so that transceiver 110 may efficiently control power related functions for the wireless signals from the antennas of antenna array 250 while also minimizing signal loss and noise. Moreover, electronic device 100 may include additional antennas for higher data throughput via the antennas and/or to provide higher gain of the wireless signals from the antennas. In some embodiments, electronic device 100 includes additional components and/or additional antennas to accommodate a carrier aggregation that is unique to a particular wireless carrier. System package 200 may efficiently accommodate the co-located components, the additional number of antennas, other components, and/or package specifications, while reducing occupying space (or maintain initial system package 200 dimensions after adding additional components and antennas). Although the following descriptions describe space reduction packaging techniques applied to a particular panel of system package 200, the techniques may also apply to the other panels of system package 200. By way of example, descriptions of the space reduction packaging techniques applied to front glass panel 232 may also apply to main logic board 233, back glass panel 234, left side panel 236, and/or right side panel 238. Details about various space reduction packaging techniques for integration of radio frequency packages are provided in relation to FIGS. 3 through 6.

Example Radio Frequency Packages

Figure 3:
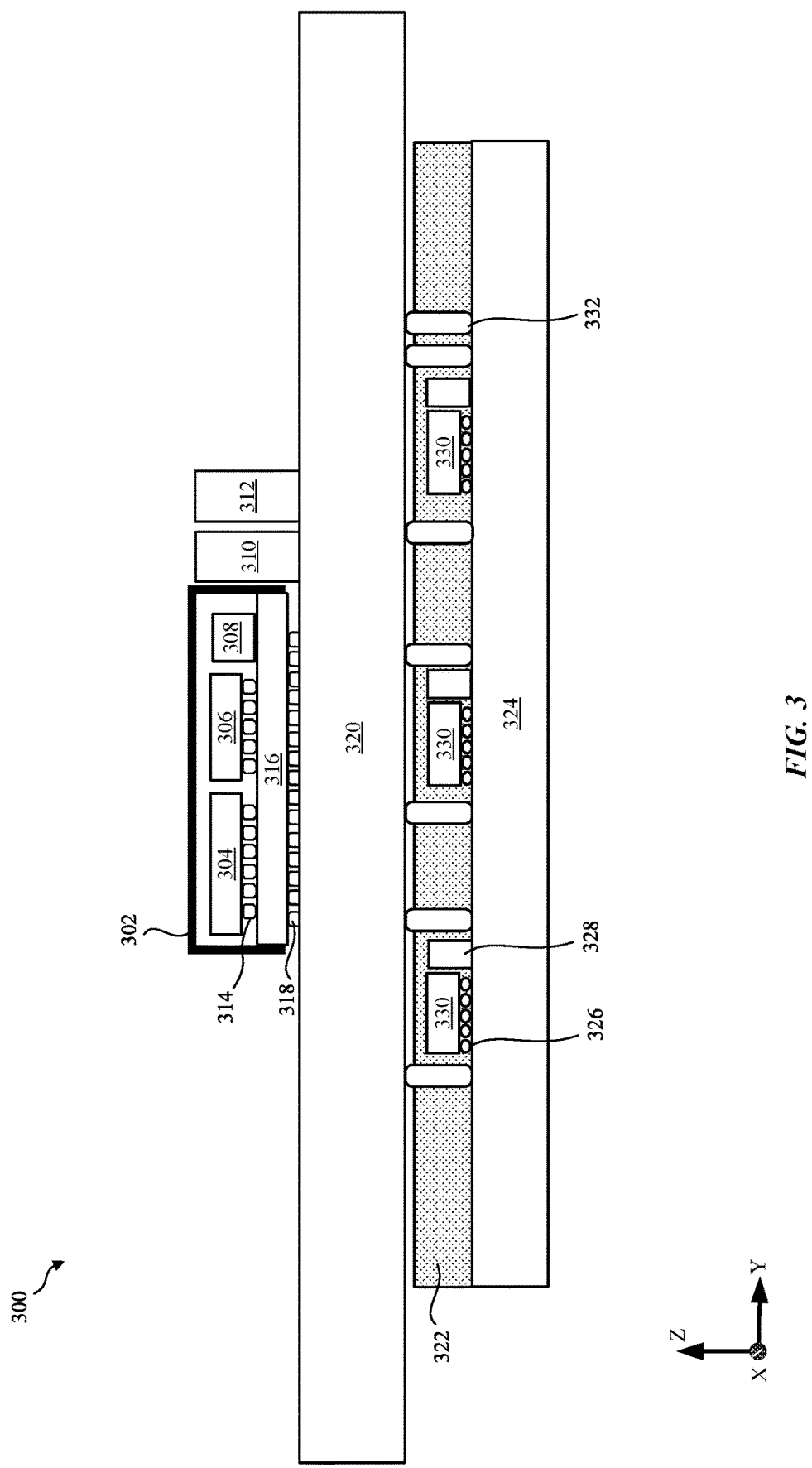
FIG. 3 is a schematic diagram of a first radio frequency package, according to one embodiment.

FIG. 3 is a schematic diagram of a radio frequency package 300 that may be integrated into electronic device 100, according to one embodiment. Radio frequency package 300 may be a system package integrated into front glass panel 232, main logic board 233, back glass panel 234, left side panel 236, or right side panel 238. Radio frequency package 300 may include a front-end package 302, a multi-layer board 320 (e.g., printed circuit board), an antenna array 324, and transceiver dies 330. Front-end package 302 may include a radio frequency front-end die 304 and a power control die 306 connected to an insulation film substrate 316 via connectors 314. Connectors 314 can be, e.g., solder ball connectors, microbumps, some other type of connectors, or some combination thereof. Insulation film substrate 316 may be implemented as, e.g., an insulating build-up material. Alternatively, insulation film substrate 316 may be replaced with an interposer. Power control die 306 may provide power control for, e.g., radio frequency front-end die 304. Power control die 306 may be stacked onto insulation film substrate 316 via connectors 314. Power control die 306 may be an embodiment of power management circuit 239 and/or power management module 241. Front-end package 302 may further include at least one passive element 308 (e.g., capacitor) stacked on insulation film substrate 316. Radio frequency package 300 may further include a passive element 310 (e.g., capacitor, inductor, or resistor) and/or a passive element 312 (e.g., capacitor, inductor, or resistor) placed onto a top side of multi-layer board 320.

Antenna array 324 and transceiver dies 330 may provide a wireless communication functionality for radio frequency package 300 and electronic device 100 that integrates radio frequency package 300. Each transceiver die 330 may be connected to antenna array 324 using connectors 326. Connectors 326 can be, e.g., solder ball connectors, microbumps, some other type of connectors, or some combination thereof. Passive elements 328 (e.g., capacitors) may be stacked onto antenna array 324, and each passive element 328 may be positioned adjacent to a respective transceiver die 330. In one or more embodiments, at least one additional tuning component (not shown in FIG. 3) is stacked onto antenna array 324.

Multi-layer board 320 may be placed between front-end package 302 and antenna array 324. Insulation film substrate 316 may be connected onto multi-layer board 320 using connectors 318. Connectors 318 can be, e.g., solder ball connectors, microbumps, some other type of connectors, or some combination thereof. Multi-layer board 320 may be replaced with a flexible board 320. Alternatively, multi-layer board 320 may be replaced with a board 320 having at least one embedded component. Antenna array 324 may be connected to multi-layer board 320 using via connectors 332. Via connectors 332 may carry signals between transceiver dies 330/antenna array 324 and one or more components of front-end package 302. Via connectors 332 may be, e.g., plated vias, copper-filled vias, some other type of vias, or some combination thereof. Radio frequency package 300 may further include a mold 322 (e.g., antenna substrate) placed on antenna array 324. Transceiver dies 330 and connectors 326 may be integrated into mold 322. When mold 322 is included into radio frequency package 300, multi-layer board 320 may be placed between front-end package 302 and mold 322.

Figure 4A:
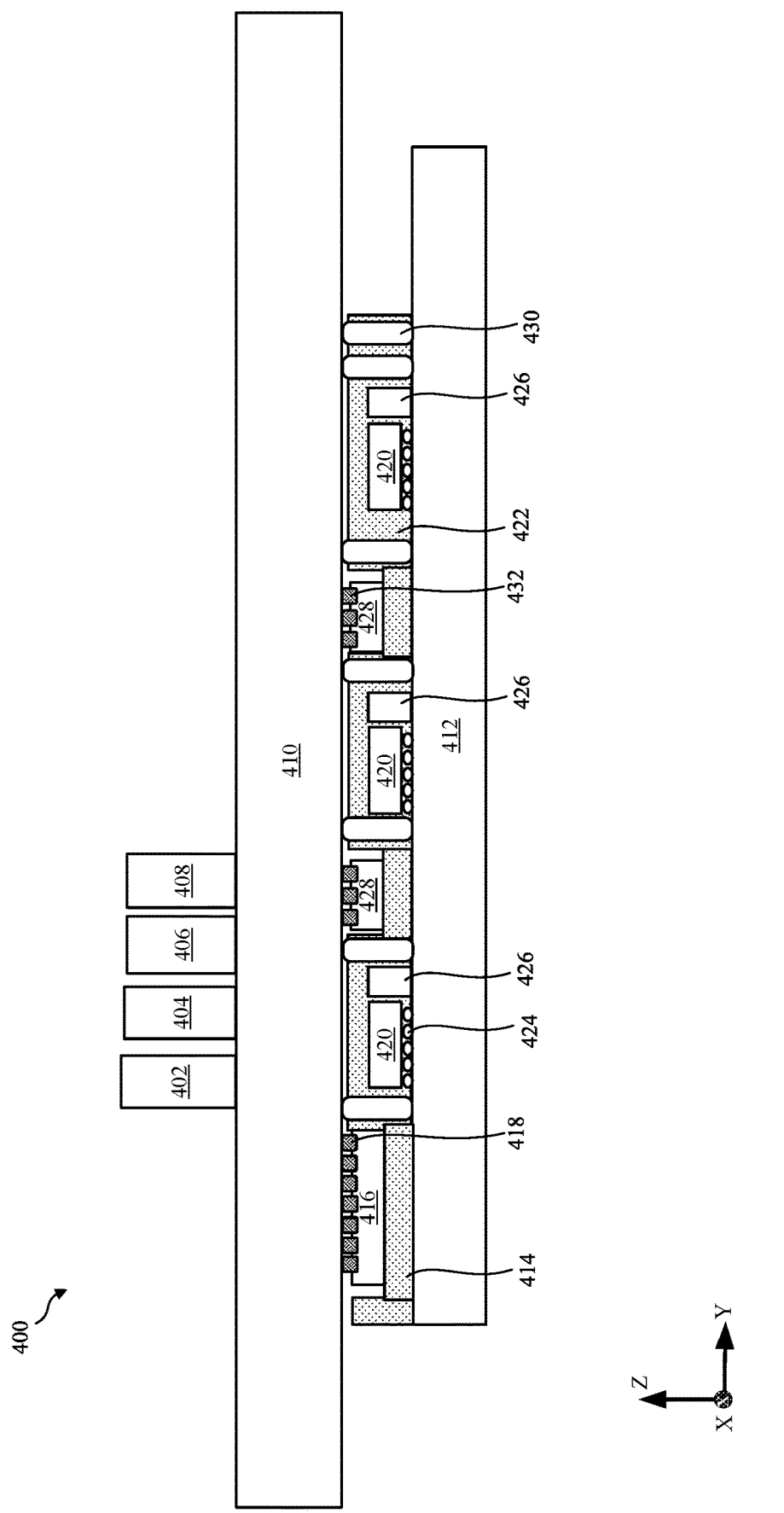
FIG. 4A is a schematic diagram of a second radio frequency package, according to one embodiment.

FIG. 4A is a schematic diagram of a radio frequency package 400 that may be integrated into electronic device 100, according to one embodiment. Radio frequency package 400 may be a system package integrated into front glass panel 232, main logic board 233, back glass panel 234, left side panel 236, or right side panel 238. Radio frequency package 400 may include an antenna array 412 and multiple transceiver dies 420 that together provide a wireless communication functionality for radio frequency package 400 and electronic device 100 that integrates radio frequency package 400. Each transceiver die 420 may be connected onto antenna array 412 using connectors 424. Connectors 424 can be, e.g., solder ball connectors, microbumps, some other type of connectors, or some combination thereof.

Radio frequency package 400 may further include a stepped mold 414 (e.g., stepped antenna substrate) having portions of different heights that is placed onto antenna array 412. Each transceiver die 420 may be integrated into stepped mold 414. Radio frequency package 400 may further include a radio frequency front-end die 416 integrated into stepped mold 414, and at least one power control die 428. At least one power control die 428 may provide power control for, e.g., radio frequency front-end die 416 and/or transceiver die 420. At least one power control die 428 may be integrated into stepped mold 414 and mounted onto multi-layer board 410 via connectors 432. Connectors 432 can be, e.g., land grid array connectors, ball grid array connectors, microbumps, some other type of connectors, or some combination thereof. At least one power control die 428 may be an embodiment of power management circuit 239 and/or power management module 241. Stepped mold 414 may be used for inclusion of at least one shielding layer into radio frequency package 400. Additionally or alternatively, stepped mold 414 may be used for inclusion of at least one thermal heat dissipating material into radio frequency package 400. Radio frequency package 400 may further include passive elements 426 (e.g., capacitors, inductors and/or resistors) integrated into stepped mold 414 and stacked onto antenna array 412. Each passive element 426 may be positioned adjacent to a respective transceiver die 420. In one or more embodiments, at least one additional tuning component (not shown in FIG. 4A) is stacked onto antenna array 412.

Radio frequency package 400 may further include a multi-layer board 410 (e.g., printed circuit board). A first (e.g., bottom) surface of multi-layer board 410 may be connected to radio frequency front-end die 416 and at least one power control die 428 using connectors 418. Connectors 418 can be, e.g., land grid array connectors, ball grid array connectors, microbumps, some other type of connectors, or some combination thereof. Antenna array 412 may be connected to multi-layer board 410 using via connectors 430. Via connectors 430 may carry signals between components at a first surface (e.g., top surface) of multi-layer board 410 and components at a second surface opposite to the first surface (e.g., bottom surface) of multi-layer board 410. Via connectors 430 may be, e.g., plated vias, copper-filled vias, some other type of vias, or some combination thereof. Radio frequency package 400 may further include passive elements 402, 404, 406, 408 (e.g., capacitors, inductors and/or resistors) of the same height or different heights stacked onto a second (e.g., top) surface of multi-layer board 410. Multi-layer board 410 may be replaced with a flexible board 410. Alternatively, multi-layer board 410 may be replaced with a board 410 having at least one embedded component.

Figure 4B:
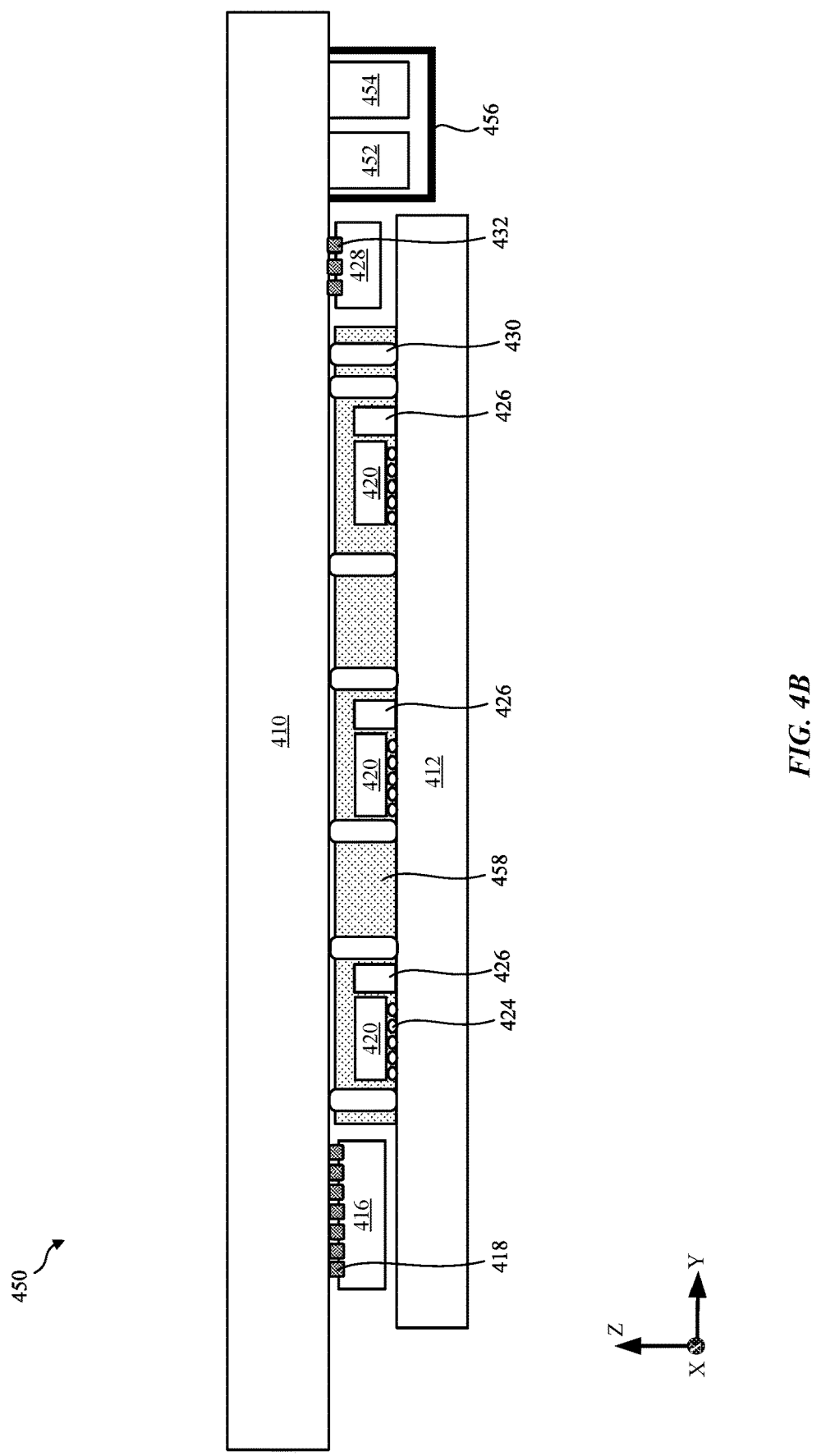
FIG. 4B is a schematic diagram of a third radio frequency package, according to one embodiment.

FIG. 4B is a schematic diagram of a radio frequency package 450 that may be integrated into electronic device 100, according to one embodiment. Radio frequency package 450 may be a system package integrated into front glass panel 232, main logic board 233, back glass panel 234, left side panel 236, or right side panel 238. Radio frequency package 450 may include multi-layer board 410 (e.g., printed circuit board), radio frequency front-end die 416, at least one power control die 428, transceiver dies 420, antenna array 412, and a pair of passive elements 452, 454.

Transceiver dies 420 and antenna array 412 may together provide a wireless communication functionality for radio frequency package 450 and electronic device 100 that integrates radio frequency package 450. Each transceiver die 420 may be connected onto antenna array 412 using connectors 424. Antenna array 412 may be connected to multi-layer board 410 using via connectors 430. Via connectors 430 may carry signals between components at a first surface (e.g., top surface) of multi-layer board 410 and components at a second surface opposite to the first surface (e.g., bottom surface) of multi-layer board 410. The first surface of multi-layer board 410 may be connected to radio frequency front-end die 416 and at least one power control die 428 using connectors 418 and connectors 432, respectively. Multi-layer board 410 may be replaced with a flexible board 410. Alternatively, multi-layer board 410 may be replaced with a board 410 having at least one embedded component.

Radio frequency package 450 may further include a mold 458 that is placed onto at least a portion of antenna array 412. Each transceiver die 420 may be integrated into mold 458. Radio frequency package 450 may further include passive elements 426 (e.g., capacitors, inductors and/or resistors) integrated into mold 458 and stacked onto antenna array 412. Each passive element 426 may be positioned adjacent to a respective transceiver die 420. In one or more embodiments, at least one additional tuning component (not shown in FIG. 4B) is stacked onto antenna array 412.

Radio frequency package 450 may further include a passive element 452 (e.g., capacitor, inductor, or resistor) and/or a passive element 454 (e.g., capacitor, inductor, or resistor) coupled to the first (e.g., bottom) surface of multi-layer board 410. Passive elements 452, 454 may be isolated from other components of radio frequency package 450 using a shielding layer 456, e.g., for mitigating signal interference. Shielding layer 456 may at least partially surround passive elements 452, 454. Each passive element 452, 454 may be an embodiment of at least one of passive elements 402, 404, 406, 408 of radio frequency package 400 of FIG. 4A. By placing some or all of passive elements 402, 404, 406, 408 at the bottom surface of multi-layer board 410, a thickness of radio frequency package 450 may be reduced relative to a thickness of radio frequency package 400.

Figure 5A:
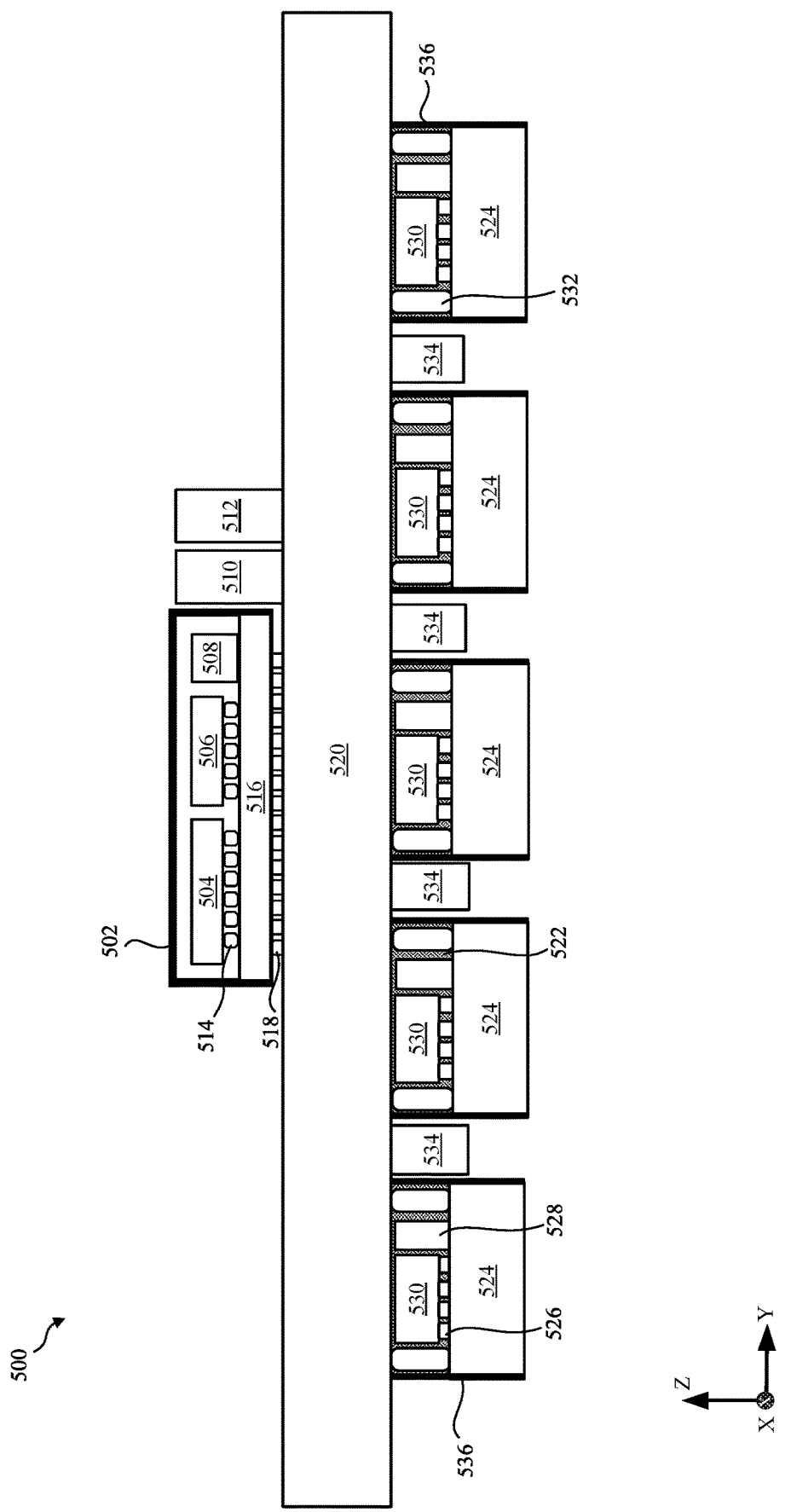
FIG. 5A is a schematic diagram of a fourth radio frequency package, according to one embodiment.

FIG. 5A is a schematic diagram of a radio frequency package 500 that may be integrated into electronic device 100, according to one embodiment. Radio frequency package 500 may be a system package integrated into front glass panel 232, main logic board 233, back glass panel 234, left side panel 236, or right side panel 238. Radio frequency package 500 may include a front-end package 502, a multi-layer board 520 (e.g., printed circuit board), antenna arrays 524, and transceiver dies 530. Front-end package 502 may include a radio frequency front-end die 504 and a power control die 506 connected to an insulation film substrate 516 via connectors 514. Connectors 514 can be, e.g., solder ball connectors, microbumps, some other type of connectors, or some combination thereof. Insulation film substrate 516 may be implemented as, e.g., an insulating build-up material. Alternatively, insulation film substrate 516 may be replaced with an interposer. Power control die 506 may provide power control for, e.g., radio frequency front-end die 504. Power control die 506 may be stacked onto insulation film substrate 516 via connectors 514. Power control die 506 may be an embodiment of power management circuit 239 and/or power management module 241. Front-end package 502 may further include at least one passive element 508 (e.g., capacitor) stacked on insulation film substrate 516. Radio frequency package 500 may further include a passive element 510 (e.g., capacitor, inductor, or resistor) and/or a passive element 512 (e.g., capacitor, inductor, or resistor) placed onto a top side of multi-layer board 520.

Antenna arrays 524 together with transceiver dies 530 may provide a wireless communication functionality for radio frequency package 500 and electronic device 100 that integrates radio frequency package 500. Each transceiver die 530 may be connected onto a respective antenna array 524 using connectors 526. Connectors 526 can be, e.g., land grid array connectors, ball grid array connectors, microbumps, some other type of connectors, or some combination thereof. A respective passive element 528 (e.g., capacitor) may be stacked on a respective antenna array 524. Each passive element 528 may be positioned adjacent to a respective transceiver die 530. There may be an available space 534 between each two adjacent antenna arrays 524. Each available space 534 may be utilized for integrating one or more additional components into radio frequency package 500, e.g., for providing improved performance.

Multi-layer board 520 may be placed between front-end package 502 and antenna arrays 524. Insulation film substrate 516 may be connected to multi-layer board 520 using connectors 518. Connectors 518 can be, e.g., solder ball connectors, microbumps, some other type of connectors, or some combination thereof. A respective antenna array 524 may be connected onto multi-layer board 520 using via connectors 532. Via connectors 532 may carry signals between transceiver dies 530/antenna arrays 524 and one or more components of front-end package 502. Via connectors 532 may be, e.g., plated vias, copper-filled vias, some other type of vias, or some combination thereof. Multi-layer board 520 may be replaced with a flexible board 520. Alternatively, multi-layer board 520 may be replaced with a board 520 having at least one embedded component. Radio frequency package 500 may further include molds 522 (e.g., antenna substrates), and each mold 522 may be placed onto a respective antenna array 524. Each transceiver die 530 and each passive element 528 may be integrated into a respective mold 522. When molds 522 are included into radio frequency package 500, multi-layer board 520 may be placed between front-end package 502 and molds 522. Each mold 522 (along with an integrated respective transceiver die 530) and a respective antenna array 524 may be protected from one or more adjacent components using a shielding layer 536 (e.g., to mitigate interference of wireless signals). Shielding layer 536 may be placed on side edges of mold 522 and a respective antenna array 524.

Figure 5B:
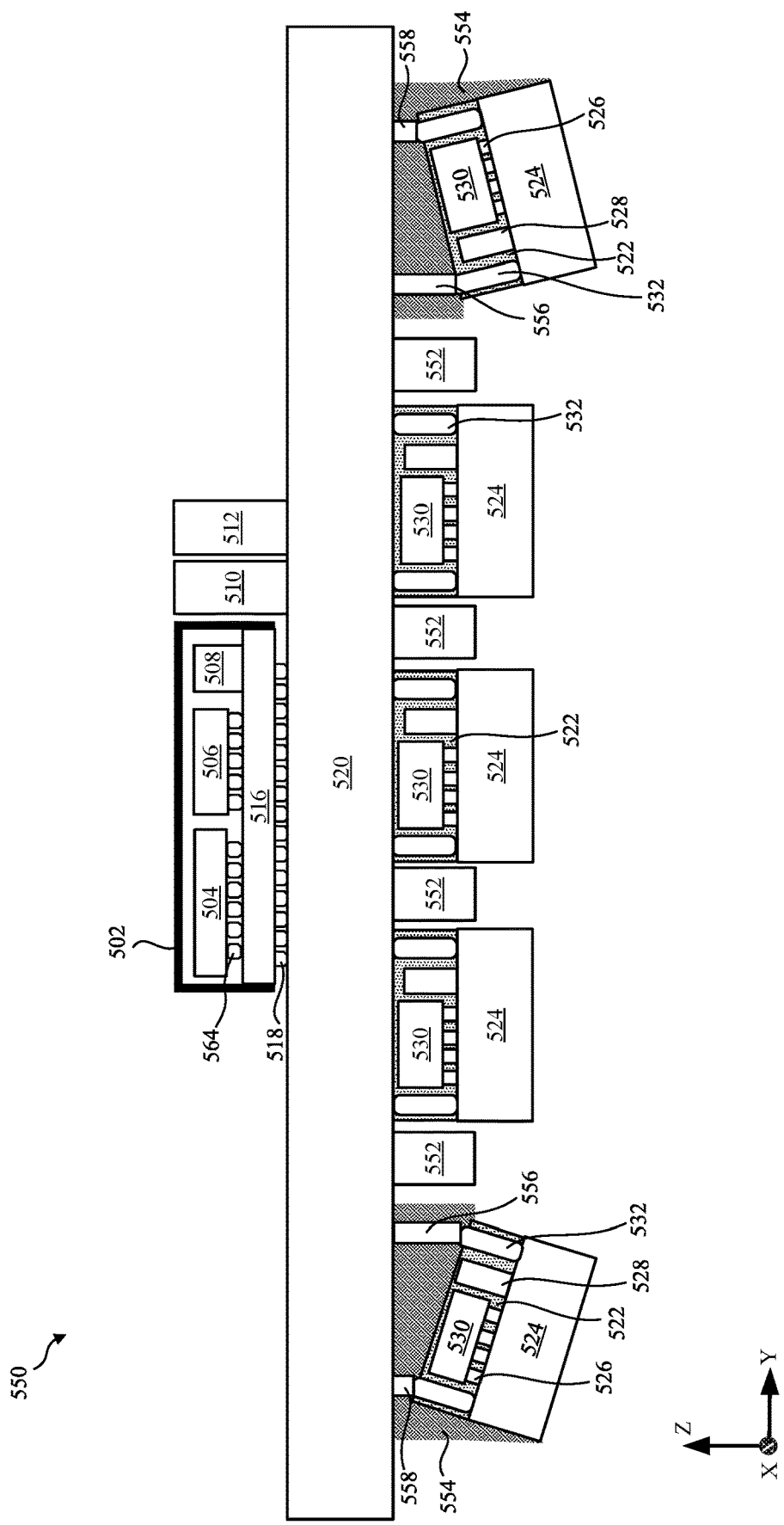
FIG. 5B is a schematic diagram of a fifth radio frequency package, according to one embodiment.

FIG. 5B is a schematic diagram of a radio frequency package 550 that may be integrated into electronic device 100, according to one embodiment. Radio frequency package 550 may be a system package integrated into front glass panel 232, main logic board 233, back glass panel 234, left side panel 236, or right side panel 238. Radio frequency package 550 may include front-end package 502, a multi-layer board 520 (e.g., printed circuit board), antenna arrays 524, and transceiver dies 530. Front-end package 502 may include radio frequency front-end die 504 and power control die 506 connected to insulation film substrate 516 via connectors 514. Front-end package 502 may further include at least one passive element 508 (e.g., capacitor) stacked on insulation film substrate 516. Radio frequency package 550 may further include passive element 510 (e.g., capacitor, inductor, or resistor) and/or passive element 512 (e.g., capacitor, inductor, or resistor) placed onto a top side of multi-layer board 520.

Antenna arrays 524 together with transceiver dies 530 may provide a wireless communication functionality for radio frequency package 550 and electronic device 100 that integrates radio frequency package 550. Each transceiver die 530 may be connected onto a respective antenna array 524 using connectors 526. A respective passive element 528 (e.g., capacitor) may be stacked on a respective antenna array 524. Each passive element 528 may be positioned adjacent to a respective transceiver die 530. There may be an available space 552 between each two adjacent antenna arrays 524. Each available space 552 may be utilized for integrating one or more additional components into radio frequency package 550, e.g., for providing improved performance.

Multi-layer board 520 may be placed between front-end package 502 and antenna arrays 524. Insulation film substrate 516 may be connected to multi-layer board 520 using connectors 518. A respective antenna array 524 may be connected onto multi-layer board 520 using via connectors 532. Via connectors 532 may carry signals between transceiver dies 530/antenna arrays 524 and one or more components of front-end package 502. Multi-layer board 520 may be replaced with a flexible board 520. Alternatively, multi-layer board 520 may be replaced with a board 520 having at least one embedded component. Radio frequency package 550 may further include molds 522 (e.g., antenna substrates), and each mold 522 may be placed onto a respective antenna array 524. Each transceiver die 530 and each passive element 528 may be integrated into a respective mold 522. When molds 522 are included into radio frequency package 550, multi-layer board 520 may be placed between front-end package 502 and molds 522.

A pair of transceiver dies 530 and a corresponding pair of antenna arrays 524 may be rotated about a vertical axis (e.g., z axis) of radio frequency package 550 by a defined angle, e.g., to improve coverage of transmitted/received wireless signals. By rotating the pair of antenna arrays 524 about the vertical axis of radio frequency package 550, directionality and space coverage of transmitted/received communication signals may be improved (e.g., omni-directionality may be achieved) relative to radio frequency package 500 of FIG. 5A. When molds 522 are included into radio frequency package 550, a respective pair of molds 522 may be also rotated along with pair of transceiver dies 530 and corresponding pair of antenna arrays 524. A respective substrate 554 may be placed between each rotated structure (e.g., mold 522 with transceiver die 530 and antenna array 524) and multi-layer board 520. Furthermore, a respective rotated antenna array 524 may be coupled to front-end package 502 using via connectors 532 that are connected to multi-layer board 520 using a corresponding inner connector 556 and a corresponding outer connector 558. Inner connectors 556 can be, e.g., solder ball connectors, microbumps, some other type of connectors, or some combination thereof. Similarly, outer connectors 558 can be, e.g., solder ball connectors, microbumps, some other type of connectors, or some combination thereof. Each rotated structure that includes mold 522, transceiver die 530 and antenna array 524 may be assembled first. After that, each assembled structure may be mounted onto corresponding inner and outer connectors 556, 558 of specific lengths (e.g., heights) so that the assembled structure may be slanted at a defined angle relative to the vertical axis of radio frequency package 550. Each rotated structure may be securely mounted to inner and outer connectors 556, 558 using corresponding via connectors 532. Substrate 554 may be an injections molded part shaped as required and plated with, e.g., a conductive post. In one embodiment, substrate 554 is implemented as a three-dimensional printed plastic with metal inserts or connector type components (e.g., inner and outer connectors 556, 558). In another embodiment, substrate 554 is implemented as a stamped plastic with laser direct imaging for defining vias (e.g., vias 532) and conductors (e.g., inner and outer connectors 556, 558).

Figure 6:
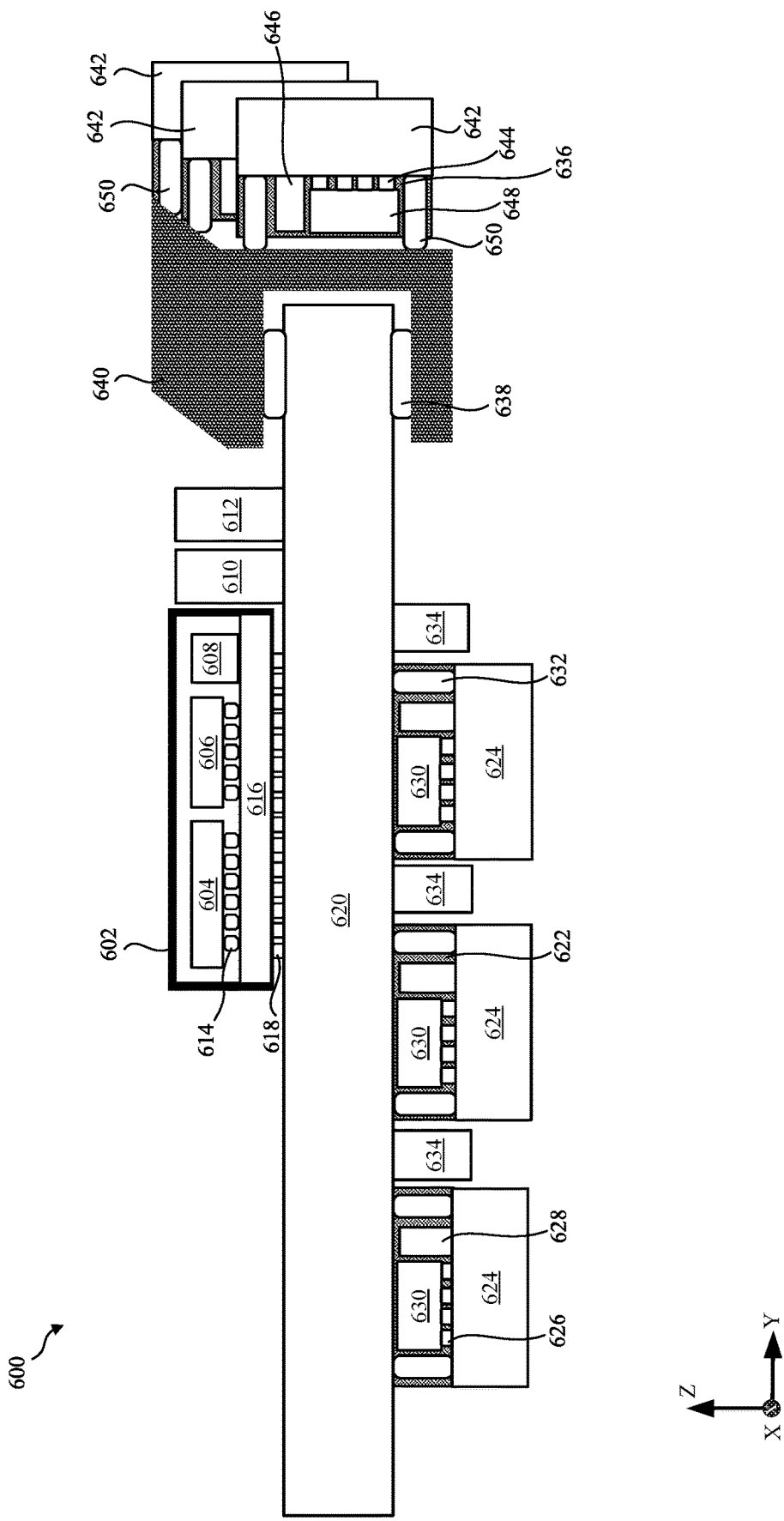
FIG. 6 is a schematic diagram of a sixth radio frequency package, according to one embodiment.

FIG. 6 is a schematic diagram of a radio frequency package 600 that may be integrated into electronic device 100, according to one embodiment. Radio frequency package 600 may be a system package integrated into front glass panel 232, main logic board 233, back glass panel 234, left side panel 236, or right side panel 238. Radio frequency package 600 may include a front-end package 602, a multi-layer board 620 (e.g., printed circuit board), antenna arrays 624, and transceiver dies 630. Front-end package 602 may include a radio frequency front-end die 604 and a power control die 606 connected to an insulation film substrate 616 via connectors 614. Connectors 614 can be, e.g., solder ball connectors, microbumps, some other type of connectors, or some combination thereof. Insulation film substrate 616 may be implemented as, e.g., an insulating build-up material. Alternatively, insulation film substrate 616 may be replaced with an interposer. Power control die 606 may provide power control for, e.g., radio frequency front-end die 604. Power control die 606 may be stacked onto insulation film substrate 616 via connectors 614. Power control die 606 may be an embodiment of power management circuit 239 and/or power management module 241. Front-end package 602 may further include at least one passive element 608 (e.g., capacitor) stacked on insulation film substrate 616. Radio frequency package 600 may further include a passive element 610 (e.g., capacitor, inductor, or resistor) and/or a passive element 612 (e.g., capacitor, inductor, or resistor) placed onto a top side of multi-layer board 620.

Antenna arrays 624 together with transceiver dies 630 may provide a wireless communication functionality for radio frequency package 600 and electronic device 100 that integrates radio frequency package 600. Each transceiver die 630 may be connected onto a respective antenna array 624 using connectors 626. Connectors 626 can be, e.g., land grid array connectors, ball grid array connectors, microbumps, some other type of connectors, or some combination thereof. A respective passive element 628 (e.g., capacitor) may be stacked on a respective antenna array 624. Each passive element 628 may be positioned adjacent to a respective transceiver die 630. There may be an available space 634 between some adjacent antenna arrays 624. Each available space 634 may be utilized for integrating one or more additional components into radio frequency package 600, e.g., for providing improved performance.

Multi-layer board 620 may be placed between front-end package 602 and some antenna arrays 624. Insulation film substrate 616 may be connected to multi-layer board 620 using connectors 618. Connectors 618 can be, e.g., solder ball connectors, microbumps, some other type of connectors, or some combination thereof. A respective antenna array 624 may be connected onto multi-layer board 620 using via connectors 632. Via connectors 632 may carry signals between transceiver dies 630/antenna arrays 624 and one or more components of front-end package 602. Via connectors 632 may be, e.g., plated vias, copper-filled vias, some other type of vias, or some combination thereof. Multi-layer board 620 may be replaced with a flexible board 620. Alternatively, multi-layer board 620 may be replaced with a board 620 having at least one embedded component. Radio frequency package 600 may further include molds 622 (e.g., antenna substrates), and each mold 622 may be placed onto a respective antenna array 624. Each transceiver die 630 and each passive element 628 may be integrated into a respective mold 622. When molds 622 are included into radio frequency package 600, multi-layer board 620 may be placed between front-end package 602 and some molds 622.

Radio frequency package 600 may further include an adhesive 640 (e.g., flex adhesive or rigid flex adhesive) coupled to multi-layer board 620 using a pair of connectors 638. Connectors 638 can be, e.g., solder ball connectors, microbumps, some other type of connectors, or some combination thereof. Instead of or in addition to being located at a top surface of multi-layer board 620 and/or a bottom surface of multi-layer board 620, at least one connector 638 may be positioned between adhesive 640 and a side surface of multi-layer board 620. At least one antenna array 642 and at least one transceiver die 648 (which is optionally integrated into mold 636 along with passive element 646) may be connected to multi-layer board 620 using via connectors 650 connected to adhesive 640. Via connectors 650 along with connectors 638 may carry signals between transceiver dies 648/antenna array(s) 642 and one or more components of front-end package 602. Via connectors 650 may be, e.g., plated vias, copper-filled vias, some other type of vias, or some combination thereof. Each structure that includes mold 636, transceiver die 648 and antenna array 642 may be assembled first. After that, each assembled structure may be mounted onto adhesive 640, which is then mounted onto the pair of connectors 638. In this manner, wireless communication performance of radio frequency package 600 may be improved as wireless signals are transmitted/received in more directions.

While particular embodiments and applications have been illustrated and described, it is to be understood that the invention is not limited to the precise construction and components disclosed herein and that various modifications, changes and variations which will be apparent to those skilled in the art may be made in the arrangement, operation and details of the method and apparatus disclosed herein without departing from the spirit and scope of the present disclosure.

What is claimed is:

1. A radio frequency package comprising:
a multi-layer board;
an insulation film substrate disposed on the multi-layer board;
a front-end package including a radio frequency (RF) front-end die and a power control die connected to the insulation film substrate with a first plurality of connectors;
an antenna array disposed on the multi-layer board and configured to provide a wireless communication functionality;
a mold disposed on the antenna array;
a plurality of via connectors extending vertically through the mold and connecting the antenna array to the multi-layer board; and
a plurality of transceiver dies, each transceiver die of the plurality of transceiver dies connected to the antenna array with a second plurality of connectors.

2. The radio frequency package of claim 1, wherein the plurality of transceiver dies and the second plurality of connectors are integrated into the mold.

3. The radio frequency package of claim 1, wherein the insulation film substrate is connected onto the multi-layer board with a third plurality of connectors.

4. The radio frequency package of claim 1, wherein the front-end package further comprises at least one passive element stacked on the insulation film substrate.

5. The radio frequency package of claim 1, wherein the first plurality of connectors comprises a first plurality of solder ball connectors, and wherein the second plurality of connectors comprises a second plurality of solder ball connectors.

6. The radio frequency package of claim 1, wherein the insulation film substrate comprises an insulating build-up material.

7. The radio frequency package of claim 1, wherein a plurality of passive elements are stacked on the antenna array, each passive element of the plurality of passive elements positioned adjacent to a respective transceiver die of the plurality of transceiver dies.

8. A radio frequency package comprising:
a multi-layer board;
an insulation film substrate disposed on the multi-layer board;
a front-end package including a radio frequency (RF) front-end die and a power control die connected onto the insulation film substrate with a first plurality of connectors;
a plurality of antenna arrays, each antenna array of the plurality of antenna arrays configured to provide a wireless communication functionality;
a plurality of transceiver dies, each transceiver die of the plurality of transceiver dies connected onto a respective antenna array of the plurality of antenna arrays with a second plurality of connectors;
a plurality of molds, wherein each mold of the plurality of molds is disposed on the respective antenna array of the plurality of antenna arrays, and wherein each transceiver die of the plurality of transceiver dies is disposed in a respective mold of the plurality of molds; and
a plurality of via connectors extending vertically through the plurality of molds and connecting the plurality of antenna arrays to the multi-layer board.

9. The radio frequency package of claim 8, wherein each transceiver die of the plurality of transceiver dies is integrated into a respective mold of the plurality of molds.

10. The radio frequency package of claim 8, wherein the insulation film substrate is connected onto the multi-layer board with a third plurality of connectors.

11. The radio frequency package of claim 8, wherein a shielding layer is placed on side edges of the respective mold and the respective antenna array.

12. The radio frequency package of claim 8, wherein a space exists between each two adjacent antenna arrays of the plurality of antenna arrays.

13. The radio frequency package of claim 8, wherein a pair of the transceiver dies and a corresponding pair of the antenna arrays are rotated about vertical axes of the radio frequency package.

14. The radio frequency package of claim 8,
wherein the multi-layer board is connected with the insulation film substrate with a third plurality of connectors; and
further comprising an adhesive coupled to the multi-layer board with a pair of connectors, at least one antenna array of the plurality of antenna arrays and at least one transceiver die of the plurality of transceiver dies connected to the multi-layer board with via connectors connected to the adhesive.

15. The radio frequency package of claim 8, further comprising a plurality of passive elements, wherein each passive element of the plurality of passive elements is positioned between a respective transceiver die of the plurality of transceiver dies and a respective via connector of the plurality of via connectors.

16. The radio frequency package of claim 8, further comprising:
a first connector comprising a first height, wherein a first via connector in the plurality of via connectors is connected to the multi-layer board with the first connector; and
a second connector comprising a second height shorter than the first height, wherein a second via connector in the plurality of via connectors is connected to the multi-layer board with the second connector.

17. A radio frequency package comprising:
an antenna array configured to provide a wireless communication functionality;
a stepped mold disposed on the antenna array;
a front-end package including a radio frequency (RF) front-end die and a power control die disposed in the stepped mold; and
a plurality of transceiver dies, each transceiver die of the plurality of transceiver dies connected onto the antenna array with a first plurality of connectors.

18. The radio frequency package of claim 17,
wherein each transceiver die of the plurality of transceiver dies is integrated into the stepped mold.

19. The radio frequency package of claim 17, further comprising a multi-layer board, wherein a bottom surface of the multi-layer board is connected to the RF front-end die and the power control die with a second plurality of connectors, and wherein the antenna array is connected to the multi-layer board with a plurality of via connectors.

20. The radio frequency package of claim 19, further comprising at least one passive element placed onto the bottom surface of the multi-layer board, the at least one passive element at least partially surrounded by a shielding layer.

* * * * *